(12) United States Patent  
Sung

(10) Patent No.: US 7,352,584 B1
(45) Date of Patent: Apr. 1, 2008

(54) DIAMOND-LIKE CARBON COATED DEVICES

(76) Inventor: Chien-Min Sung, 64 Chung-San Road, Ying Ko Factory, Taipei County, Taiwan 23911 (CN)

(*) Notice: Subject to any disclaimer, the term of this patent is extended or adjusted under 35 U.S.C. 154(b) by 137 days.

(21) Appl. No.: 11/201,772

(22) Filed: Aug. 10, 2005

Related U.S. Application Data

(63) Continuation-in-part of application No. 11/127,757, filed on May 10, 2005, now abandoned.

(51) Int. Cl.
*H05K 7/20* (2006.01)

(52) U.S. Cl. ............... 361/708; 361/695; 361/714; 428/408; 428/412; 428/527

(58) Field of Classification Search ............... 361/679, 361/683, 687, 688, 689, 700, 701–714; 428/34.4, 428/408, 402, 412, 500; 427/523, 530, 528, 427/525; 138/137, 145; 188/378, 381; 92/49, 92/96, 103 R; 417/44.9; 118/723 FI
See application file for complete search history.

(56) References Cited

U.S. PATENT DOCUMENTS

| 4,746,538 A | 5/1988 | Mackowski |
| 4,809,876 A | 3/1989 | Tomaswick et al. |
| 5,009,966 A | 4/1991 | Garg et al. |
| 5,391,407 A | 2/1995 | Dearnaley |
| 5,391,422 A * | 2/1995 | Omori et al. ............... 428/212 |
| 6,340,393 B1 | 1/2002 | Yoshida |
| 6,585,870 B1 | 7/2003 | Pitcher et al. |
| 6,589,619 B1 | 7/2003 | Nagashima |
| 6,660,340 B1 * | 12/2003 | Kirkpatrick ............... 427/530 |
| 6,805,931 B2 | 10/2004 | Nagashima |
| 6,893,720 B1 * | 5/2005 | Nakahigashi et al. ....... 428/408 |
| 7,110,506 B2 * | 9/2006 | Radley et al. ............... 378/141 |
| 2004/0200599 A1 | 10/2004 | Bradley |
| 2006/0046066 A1 * | 3/2006 | Lin et al. ................... 428/412 |

FOREIGN PATENT DOCUMENTS

| DE | 20121115 U1 * | 4/2003 |
| JP | 411346081 A * | 12/1999 |
| JP | 2004276779 A * | 10/2004 |

* cited by examiner

*Primary Examiner*—Michael Datskovskiy
(74) *Attorney, Agent, or Firm*—Thorpe North & Western LLP

(57) ABSTRACT

Thermally dynamic housings and methods of utilizing and manufacturing such housings are disclosed and described. In one embodiment, a thermally dynamic housing is provided which encloses and cools an area containing a heat source. The housing may include a metal layer having internal and exterior surfaces and a diamond-like carbon layer coupled to the exterior surface of the housing.

43 Claims, 1 Drawing Sheet

DIAMOND-LIKE CARBON COATED DEVICES

PRIORITY DATA

This patent application is a continuation-in-part of U.S. patent application Ser. No. 11/127,757 filed May 10, 2005 now abandoned, which is incorporated herein by reference in its entirety.

FIELD OF THE INVENTION

The present invention relates generally to thermally dynamic housings for use in cooling the interior of heat generating devices, and to methods associated therewith. Accordingly, the present invention involves the fields of chemistry, metallurgy, electronics, and materials science.

BACKGROUND OF THE INVENTION

In today's technologically advanced society, electronics are widespread and are found in many shapes and sizes. Particularly, computers, cell phones, and PDA's have found their way into virtually every home and office.

All electronic devices require many integral components in order to function. Generally, most electronic devices require a circuit board which contains many micro-devices such as processors, resistors, transistors and regulators. A number of these and other electronic components generate heat, particularly high power consuming components such as central processing unit (CPU). Significant amounts of heat can be detrimental to electronic devices by, for example, causing burn out or shorting, and ultimately reducing the longevity thereof.

A number of heat dissipating devices have been introduced in an effort to remove heat generated by the components of an electronic device. Examples of such heat moving devices include fans, heat spreaders, and heat sinks, among others. Despite the effectiveness of such devices in removing heat from the specific heat generating components of the electronic device, the build up of heat inside the device as a whole typically continues due to the inability of the device housing, or casing, to effectively transfer heat out of the device completely. One specific way in which this issue has been addressed is by using a fan. Case fans are typically mounted inside the device, for example a computer, with the fan blades positioned to expel hot air out of the case and into the surrounding environment. Generally, a computer case will include several case fans, positioned mainly in the front of the case and also in the back of the case, such positioning allows for a continuous air flow to pass through the case, thus decreasing the internal temperature. Recently, others have placed case fans on the top and sides of the case to force the air out from all directions.

These methods have a number of limitations. First of all, the internal case fans generate heat during operation, therefore the case fans actually add to the overall temperature inside the device housing. Furthermore, they require energy to work. The energy is drawn from the on-board power supply, thereby increasing the overall operation cost of the computer. In addition, since case fans involve moving parts, inevitably noise levels will increase which could be annoying and bothersome to the user.

As such, simple, efficient systems or devices which can decrease the internal temperature of an electronic device which requires little or no energy to cool the device continues to be sought through on-going research and development efforts.

SUMMARY OF THE INVENTION

Accordingly, the present invention provides materials and methods for cooling an area that contains a heat generating component.

In one embodiment, the present invention resolves the problems set forth above by providing a thermally dynamic housing which encloses and cools an area containing a heat source. In some embodiments, the thermally dynamic housing of the present invention may include: i) a metallic layer having an internal surface facing the area with the heat source, and an exterior surface facing away from the area; and ii) a diamond-like carbon layer contiguous with at least a portion of the exterior surface of the metallic layer. Functionally, the housing accelerates the transfer or movement of heat from within the enclosed space, or area, to a location outside the device.

The present invention additionally encompasses methods for cooling a space, or area of a device, that contains a heat source. In some aspects, such a method may include the step of utilizing a thermally dynamic housing as disclosed herein for the housing, or casing of the device.

The present invention further encompasses methods of making a device that actively discards internal heat. In one aspect, such a method may include enclosing an area having a heat source with a thermally dynamic housing as disclosed herein.

DETAILED DESCRIPTION

Figure 1:
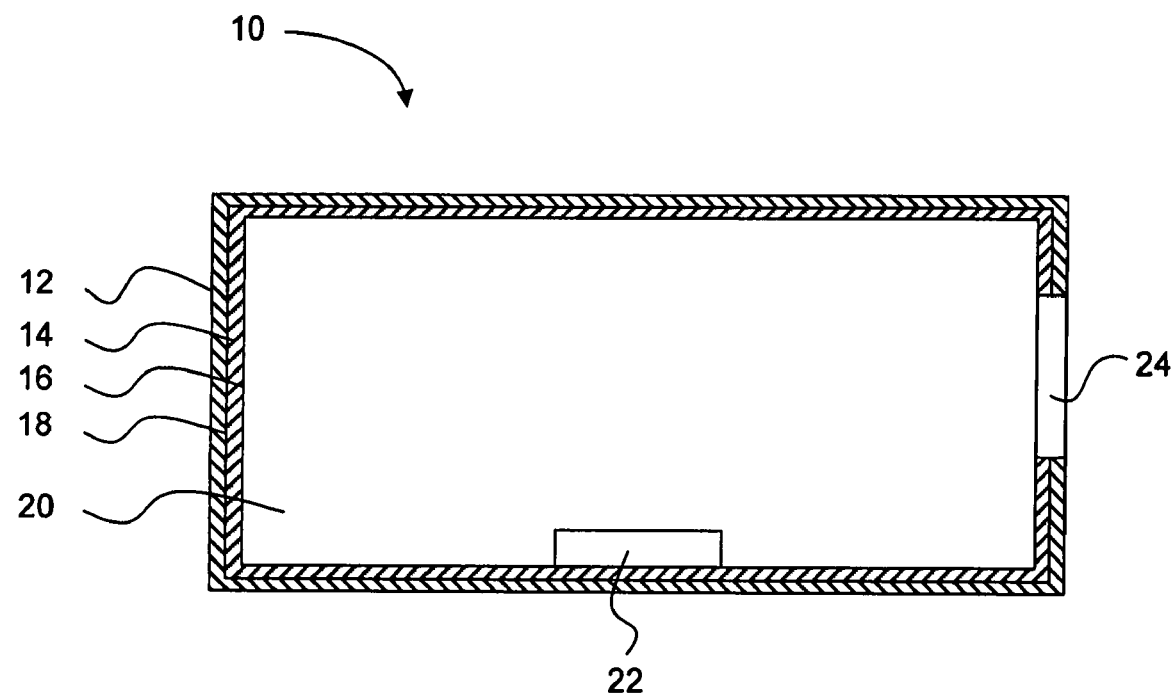
FIG. 1 is a schematic view of a thermally dynamic housing enclosing a space in accordance with an embodiment of the present invention.

Reference will now be made to exemplary embodiments and specific language will be used herein to describe the same. It will nevertheless be understood that no limitation of the scope of the invention is thereby intended. Alterations and further modifications of the inventive features, process steps, and materials illustrated herein, and additional applications of the principles of the inventions as illustrated herein, which would occur to one skilled in the relevant art and having possession of this disclosure, are to be considered within the scope of the invention. It should also be understood that terminology employed herein is used for the purpose of describing particular embodiments only and is not intended to be limiting.

A. DEFINITIONS

In describing and claiming the present invention, the following terminology will be used.

The singular forms "a," "an," and "the" include plural referents unless the context clearly dictates otherwise. Thus, for example, reference to "a transfer region" includes reference to one or more of such regions, and reference to "an alloy" includes reference to one or more of such alloys.

As used herein, "metallic" refers to any type of material or compound wherein the majority portion of the material is a metal. As such, various oxide, nitride, and carbide compounds, as well as any other material or compound, containing a greater non-metal portion than metal portion are not considered to be "non-metallic." Examples of various metals considered to be particularly useful in the practice of the present invention include, without limitation: aluminum, tungsten, molybdenum, tantalum, zirconium, vanadium, chromium, magnesium, lithium, iron, titanium, beryllium, copper, and alloys thereof. Further, such metals may be treated or otherwise altered, for example "anodized" in order to prevent oxidation or other adverse degradation processes.

As used herein, "vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), metal-organic CVD (MOCVD), sputtering, thermal evaporation PVD, ionized metal PVD (IMPVD), electron beam PVD (EBPVD), reactive PVD, and the like.

As used herein, "chemical vapor deposition," or "CVD" refers to any method of chemically depositing diamond particles in a vapor form upon a surface. Various. CVD techniques are well known in the art such as plasma CVD, metal-organic CVD (MOCVD), and molecular beam epitaxy CVD (MBE CVD) as disclosed in U.S. Pat. No. 6,340,393 incorporated herein by reference.

As used herein, "physical vapor deposition," or "PVD" refers to any method of physically depositing diamond particles in a vapor form upon a surface. Various PVD techniques are well known in the art such as sputtering, thermal evaporation PVD, and ionized PVD, as disclosed in U.S. Pat. No. 6,585,870 incorporated herein by reference.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including its physical and electrical properties are well known in the art.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm$^3$). Further, amorphous diamond and diamond materials contract upon melting.

As used herein, "heat source" refers to a device or object having an amount of thermal energy or heat which is greater than ambient room temperature. Heat sources can include devices that produce heat as a byproduct of their operation (hereinafter known as "primary heat sources" or "active heat sources"), as well as objects that become heated by a transfer of heat energy thereto (hereinafter known as "secondary heat sources" or "passive heat sources"). Examples of primary or active heat sources include without limitation, CPU's, electrical lines, LED's, etc. Examples of secondary or passive heat sources include without limitation, heat spreaders, heat sinks, etc.

As used herein, "enclosure" refers to an area that is partially, substantially, or completely surrounded by a casing or housing, which defines an internal space or area, which can contain a heat source and optionally other components.

As used herein, "space" refers to an area or region containing a degree of emptiness. In some aspects, a space can be within, or substantially within, an enclosure defined by a housing or casing.

As used herein, "thermally dynamic" is a descriptive term that may be used to refer to the property of actively transferring thermal energy from one location to another. As will be recognized by those of ordinary skill in the art, different mediums may have different abilities to transfer thermal energy, and certain mediums or materials that are thermally dynamic have an ability to accelerate transfer of heat energy from one location to another as compared to the same amount of thermal energy for the same distance through the air.

As used herein, "housing" or "casing" refers to an outer cover designed to protect, enclose and/or support mechanical and/or electrical components. In some aspects the housing in the present invention may be opaque.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a numerical range of "about 1 micrometer to about 5 micrometers" should be interpreted to include not only the explicitly recited values of about 1 micrometer to about 5 micrometers, but also include individual values and sub-ranges within the indicated range. Thus, included in this numerical range are individual values such as 2, 3, and 4 and sub-ranges such as from 1-3, from 2-4, and from 3-5, etc. This same principle applies to ranges reciting only one numerical value and should apply regardless of the breadth of the range or the characteristics being described.

THE INVENTION

The present invention encompasses a thermally dynamic housing which encloses an area and methods for transferring heat away from an enclosed area having a heat source. In one aspect, the housing may include a metal layer having an internal surface facing towards the enclosed area and an exterior surface facing away from the area. Further, a diamond-like carbon layer may be contiguous with at least a portion of the exterior surface of the metallic layer. It has been found that such housings in accordance with the present invention can accelerate the transfer of heat from within the area inside the housing to a location outside the housing as compared to other materials such as plastic, metal by itself, etc., typically used to house electronic and other heat generating equipment. In some additional aspects, the transfer of heat may even be accelerated through the housing as compared to having no housing at all.

Nearly any device that employs a housing or casing that encloses an area containing a heat source, yet should be kept as cool as possible, can employ the thermally dynamic housing of the present invention. The heat source may be a passive heat source which radiates or transfers heat to the surrounding area. For example, a heat sink being configured to transfer heat away from an active heat source. In an alternative embodiment, the heat source may be an active heat source which generates or produces heat and transfers heat to the surroundings. For example, the active heat source may be a heat generating electronic component such as a silicon central processing unit (CPU), an LED, or any number of electronic devices which produce heat as a byproduct of operation.

As noted above, according to the present invention a diamond-like carbon layer can be coupled to a metallic layer in order to improve acceleration of heat transfer from the area inside the casing to a location outside the casing. In contrast, a housing of other typical materials, such as plastic, or even of metal or metal alloys only, may not transfer heat from the inside to the outside of the device as well as the combination of metal and DLC. The thermal conductivity of diamond at room temperature (about 2000 W/mK) is much higher than either copper (about 400 W/mK) or aluminum (250 W/mK), the two fastest metal heat conductors commonly used. Moreover, the thermal capacity of diamond (1.5 J/cm$^3$) is much lower than copper (17 J/cm$^3$) or aluminum (24 J/cm$^3$). Therefore, the ability for diamond to carry away heat without storing it makes diamond and diamond-like carbon materials ideal for coating electronic casings. In combination, a metallic material coupled with a DLC layer, creates a thermally dynamic housing with superior heat transferring properties conducive to transferring heat away from an enclosed area containing a passive or active heat source. To further illustrate this point Table 1 shows various thermal properties of several materials as compared to diamond (values provided at 300 K).

TABLE 1

| Material | Thermal Conductivity (W/mK) | Heat Capacity (J/cm$^3$ K) | Thermal Expansion (1/K) |
| --- | --- | --- | --- |
| Copper | 401 | 3.44 | 1.64E−5 |
| Aluminum | 237 | 2.44 | 2.4E−5 |
| Molybdenum | 138 | 2.57 | 4.75E−5 |
| Gold | 317 | 2.49 | 1.43E−5 |
| Silver | 429 | 2.47 | 1.87E−5 |
| Tungsten Carbide | 95 | 2.95 | 0.57E−5 |
| Silicon | 148 | 1.66 | 0.258E−5 |
| Diamond (IIa) | 2,300 | 1.78 | 0.14E−5 |

Transferring heat away from an enclosed area containing a heat source through a thermally dynamic housing may be accomplished by conduction, convection, and/or radiation. In some aspects, the metal layer of the thermally dynamic housing of the present invention may conduct thermal energy, or heat, from the enclosed area into the DLC layer which then radiates thermal energy to the surrounding atmosphere.

As is known by those skilled in the art, most materials have the ability to radiate thermal energy when exposed to extreme temperature, i.e. above 1000° F. However, most materials are poor thermal radiators at low temperatures, e.g. below about 212° F. For example, materials such as metals have strong thermal conducting properties, yet are unable to emit thermal energy to the surroundings at low temperatures without the help of some convecting force. Diamond-like carbon materials, on the other hand, are unique because they have the ability to both conduct heat and radiate heat at low temperatures, such as temperatures below about 212° F.

Heat transfer via radiation is the emission of thermal energy in the form of waves, rays, or photons. A theoretical "black body" is an object or material that can absorb and emit 100% of the thermal energy incident upon its surface. Most materials and their ability to absorb and emit thermal energy are gauged or compared to a black body. It has now been discovered that unlike most other materials, DLC has the ability to radiate heat at low temperatures, such as temperatures below about 212° F. Thus, forming a housing having an external DLC layer coupled contiguously to a metal layer produces a superior housing for transferring thermal energy away from an area containing a heat source. In this manner, heat is received by the metal layer from the heat source and then conducted through the metal layer to the DLC layer. The DLC layer then radiates the heat away from the housing. As a result, heat is dumped out of the housing at a rate that is much faster than if a metal layer alone were used and convection forces were necessary to carry heat away from an outside surface of the metal layer. The increased rate of heat dumping or transfer in turn allows additional heat energy to enter the housing at an accelerated rate and provides the cumulative effect of cooling the heat source faster than a housing of metal alone.

In addition to creating a thermally dynamic housing with superior heat transferring properties, a DLC layer coupled to an external surface of a metallic layer may provide additional protection and durability to the metallic layer. When coupled the DLC layer may protect the metallic layer from various forms of damage, such as scratching, abrasion, and corrosion, to name a few. This aspect may be important where durability is an issue, such as with portable electronic devices.

Referring now to FIG. 1 a thermally dynamic housing device is shown generally at 10 in accordance with one embodiment of the present invention. A metallic layer 14 can be shaped in a desired configuration to enclose the area 20. The area 20 can contain a heat source 22 which provides and substantially increases the temperature within the enclosure. In some aspects, there may be little or no empty space within the area. However, depending on the particular device to be made, the area may include significant amounts of empty space.

The metallic layer 14 may be formed into any enclosure shape required by a specific device and generally has an internal surface 16 and an exterior surface 18. The exterior surface 18 can receive or be coupled to a diamond-like carbon layer 12 to form the thermally dynamic housing. In use, heat generated from the heat source 22 is convected to the internal surface of the housing, and then is accelerated through the housing to a location outside thereof.

A variety of thermally conductive materials may be used for the metallic layer 14. Preferably, the layer can be fabricated from a highly conductive, lightweight and durable metallic material. Furthermore, it is preferable that such materials be conducive for bonding or coupling with diamond-like carbon materials. Specific examples of metal materials that can be use include without limitation, aluminum, tungsten, molybdenum, tantalum, zirconium, vanadium, chromium, magnesium, lithium, iron, titanium, beryllium, copper, and alloys or composites thereof. In some aspects, the metallic layer can be or consist solely of a metal material. In one aspect, the metal may be aluminum, or an alloy thereof. In another aspect, the metal may be copper, or an alloy thereof. In yet another aspect, the metal may be an aluminum-magnesium-lithium alloy. In still another aspect, the metal may be an aluminum-beryllium alloy. Additionally, a ceramic material may be incorporated or doped with a metal to form the metallic layer. In some aspects, the ceramic material can be aluminum oxide ($Al_2O_3$), aluminum nitride, magnesium oxide, $LaMnO_3$ (LSM), zirconium oxide ($ZrO_2$), silicon, silicon nitride ($Si_3N_4$), and silicon carbide.

In still another aspect, other materials may be employed to facilitate or improve the deposition of DLC, such as metallic, ceramic or adhesive materials. These materials may be disposed onto the metallic layer prior to depositing on the DLC coating. For example, a metallic layer comprising a titanium alloy may be bonded to an aluminum alloy metallic layer. Subsequently, a layer of diamond-like carbon material can be coupled to the titanium alloy layer to enhance the overall thermal conductivity properties of both layers. In another embodiment the diamond-like carbon layer may be a plurality of diamond-like carbon layers bonded to a metallic layer.

The metallic layer 14, can be formed into any desired shape needed to make a thermally dynamic device by enclosing an area containing a heat source. For example, metallic layer 14 can be formed in the shape of a standard desktop computer chassis having four sides, a top and bottom. In another embodiment of the present invention, the metal layer can be formed in the shape of a notebook, a personal digital assistant (PDA), MP3 player, a satellite receiver, a digital video recorder (DVR), a hard drive, a cell phone, video cassette recorder (VCR), a digital video disc player (DVD) casing, or any other electronic or portable electronic device case which generates heat internally as a byproduct of its operation. Depending on the needs of the desired device, the metallic layer can be formed into a fully enclosing casing or it can be formed into an enclosure which contains breaks, seams, windows, holes, vents or other openings in the casing.

In one embodiment of the present invention, the metallic layer 14 may have an internal surface 16, which is fabricated into a plurality of internal compartments, sections or regions. For example, the internal surface can be manufactured to house a power supply for the electronic device. In another embodiment the internal surface may be shaped with several contours or protrusions which conform to any internal circuitry or components, such as a mother board or hard drive bays. Nearly any configuration for the casing that is suitable for a desired device or purpose can be accommodated.

In some embodiments, as required by the needs of a given device, the exterior surface 18 of the metallic layer 14, can be substantially flat with a relatively large surface area. Such a configuration may in some aspects, further help in the absorption and acceleration of heat from the enclosed area to a location outside the casing. In addition, the exterior surface may be prepared to allow proper coupling or bonding of an amorphous carbon material such as diamond-like carbon materials. For example, the exterior surface may be acid washed, etched or abraded to provide a more conducive diamond-like carbon nucleation site.

In accordance with the present invention, at least one diamond layer 12 can be coated on and extend along at least a portion of the exterior surface 18 of the metallic layer 14. In one aspect of the present invention the diamond layer may include DLC materials. In another aspect, a DLC layer may be contiguous with at least a portion of the metallic layer 14. The layer 12 can have any thickness shape, or dimension that facilitates the ability of the housing to accelerate heat. However, in one aspect, the layer may have a thickness of from about 0.5 microns to about 5 microns. In another embodiment the thickness may be from about 10 microns to about 100 microns.

As previously mentioned, in accordance with the present invention, the DLC coating on the exterior surface 18 of the metallic layer 14 can be selective in order to accommodate areas of higher thermal activity (i.e. hot spots).and accelerate the heat transfer in such locations. By selectively coating the metallic layer in only those areas having higher thermal activity, heat may be effectively accelerated through the housing while minimizing the cost of production and materials.

A number of specific methods and techniques are known for deposition of DLC, amorphous diamond, or diamond onto a substrate, such as a metal material including physical vapor deposition (PVD) and chemical vapor deposition (CVD). In accordance with the present invention, any suitable deposition process may be used to create the diamond layer. Further, specific deposition conditions may be used in order to adjust the exact type of material to be deposited, whether DLC, amorphous diamond, or pure diamond. In one embodiment, a diamond-like carbon layer may be deposited onto a metallic layer through a PVD sputtering process. In another embodiment, the diamond-like carbon may be deposited on the metallic layer by a thermal evaporation PVD process.

In an alternative embodiment an external cooling source can be disposed in thermal communication with the thermally dynamic housing. The external cooling source can be any apparatus that can aid in the reduction of the temperature of the enclosed area. For example, the external cooling source can be a fan. In some cases the internal temperature can be reduced to about ambient temperatures with the use of an external cooling source. In other embodiments the external cooling source may provide an evaporative cooling effect that can reduce the internal temperature to less than ambient temperature. For example, the surface of the DLC material may be textured in order to create a surface where water molecules can be formed or collected. Once water is present on the housing surface, air may be over the housing in order to increase the evaporation rate and thus further accelerate the transfer of heat out of the enclosed area of the device.

In another embodiment of the present invention, a thermally dynamic housing enclosing an area having an active heat source and an internal working fluid is provided. The internal working fluid can be any known to those skilled in the art, and in one aspect the fluid can be water or water vapor. The housing can be substantially sealed to maintain the working fluid within the housing. The working fluid as described herein, may be a passive heat energy source. The active heat source can be disposed into the enclosed area so that the heat source is in direct contact with the working fluid. In some aspects, the active heat source can be coupled to the inner surface of the bottom, top, or side walls of the housing.

As the active heat source is in direct contact with the working fluid, the working fluid can more efficiently transfer heat from the active heat source. Typically, the working fluid, contacts the heat source and becomes vaporized as it absorbs heat from the heat source. The water vapor can then condense in liquid form on the side walls or top of the housing, after which, the liquid will migrate back, via the walls of the housing, to contact the heat source, where it will again vaporize and repeat the cycle. As the walls of the housing can be made of a metallic material coupled with a diamond-like carbon layer having a high coefficient of thermal conductivity, heat is dissipated from the walls of the housing through the DLC layer into the surrounding atmosphere. This embodiment of the present invention may be further used with additional heat dissipating devices such as heat spreaders, heat pipes and heat sinks. Various heat spreaders and heat pipes which may benefit from the present invention have been disclosed in co-pending applications Nos. 10/453,469, 10/775,543, 10/769,554 and 11/056,339, which are incorporated herein by reference in their entirety.

In addition to the above-recited devices and configurations, the present invention encompasses methods for cooling an enclosed area containing a heat source. In one aspect, such a method may include the step of utilizing the thermally dynamic housing disclosed herein as the casing or housing that encloses the area having the heat source. The method can further include the step of providing an external cooling source, such as a fan, disposed in thermal communication with the housing.

The present invention also includes methods for the production of a device that actively discards internal heat. In one aspect, such a method may include enclosing an area having a heat source with a thermally dynamic housing as recited herein.

It is, of course, to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A thermally dynamic housing for enclosing and cooling an area containing a heat source comprising:
    a metallic layer having an internal surface facing the area and an exterior surface facing away from the area; and
    a diamond-like carbon layer coupled contiguously along at least a portion of the exterior surface of the metallic layer, wherein the diamond-like carbon layer includes a textured surface, wherein the textured surface is configured to collect and contain water molecules,
    wherein said housing accelerates transfer of heat from within the area to a location outside the area.

2. The thermally dynamic housing of claim 1, further comprising an external cooling source disposed in thermal communication with said housing.

3. The thermally dynamic housing of claim 2, wherein the external cooling source is a fan.

4. The method for cooling an area containing a heat source and substantially enclosed by a housing as recited in claim 1, further comprising the step of providing an external cooling source disposed in thermal communication with said housing.

5. The method of claim 4, wherein the external cooling source is a fan.

6. The thermally dynamic housing of claim 1, wherein the metallic layer is an aluminum-magnesium-lithium alloy.

7. The thermally dynamic housing of claim 1, wherein the heat source is an active heat source.

8. The thermally dynamic housing of claim 7, wherein the active heat source is a heat generating electronic component.

9. The thermally dynamic housing of claim 1, wherein the housing cools the area containing the heat source at a rate which is higher than a housing comprised of a metallic material alone.

10. A method for cooling an area containing a heat source and substantially enclosed by a housing comprising:
    utilizing as the housing, a housing as recited in claim 1.

11. The method of claim 10, wherein the housing is comprised of a metallic layer that is an aluminum-magnesium-lithium alloy.

12. The method of claim 10, wherein the heat source is an active heat source.

13. The method of claim 12, wherein the active heat source is a heat generating electronic component.

14. The method of claim 10, wherein the step of utilizing a housing further includes cooling the area containing the heat source at a rate which is higher than a housing comprised of a metallic material alone with said housing.

15. A method of making a device that actively discards internal heat, comprising:
    enclosing an area having a heat source with a thermally dynamic housing as recited in claim 1.

16. The thermally dynamic housing of claim 1, wherein the housing is formed into a notebook chassis or a computer desktop chassis.

17. A thermally dynamic housing for enclosing and cooling an area containing a heat source, comprising:
    a metallic layer having an internal surface area facing the area and an exterior surface facing away from the area; and
    a diamond-like carbon layer coupled contiguously along at least a portion of the exterior surface of the metallic layer,
    wherein said housing accelerates transfer of heat from within the area to a location outside the area, and further comprising an external cooling source disposed in thermal communication with the housing, wherein the external cooling source is a fan.

18. The thermally dynamic housing of claim 17, wherein the metallic layer is an aluminum-magnesium-lithium alloy.

19. The thermally dynamic housing of claim 17, wherein the heat source is an active heat source.

20. The thermally dynamic housing of claim 19, wherein the active heat source is a heat generating electronic component.

21. A method of making a device that actively discards internal heat, comprising:
    enclosing an area having a heat source with a thermally dynamic housing as recited in claim 17.

22. The thermally dynamic housing of claim 17, wherein the housing is formed into a notebook chassis or a computer desktop chassis.

23. The thermally dynamic housing of claim 17, wherein the housing cools the area containing the heat source at a rate which is higher than a housing comprised of a metallic material alone.

24. A method for cooling an area containing a heat source and substantially enclosed by a housing comprising:

utilizing as the housing, a housing as recited in claim 17.

25. The method of claim 24, wherein the housing is comprised of a metallic layer that is an aluminum-magnesium-lithium alloy.

26. The method of claim 24, wherein the heat source is an active heat source.

27. The method of claim 26, wherein the active heat source is a heat generating electronic component.

28. The method of claim 24, wherein the step of utilizing a housing further includes cooling the area containing the heat source at a rate which is higher than a housing comprised of a metallic material alone with said housing.

29. A thermally dynamic housing for enclosing and cooling an area containing a heat source comprising:

a metallic layer having an internal surface facing the area and an exterior surface facing away from the area; and a diamond-like carbon layer coupled contiguously along at least a portion of the exterior surface of the metallic layer, wherein said housing accelerates transfer of heat from within the area to a location outside the area, and wherein the housing is formed into a notebook chassis or a computer desktop chassis.

30. The thermally dynamic housing of claim 29, further comprising an external cooling source disposed in thermal communication with said housing.

31. The thermally dynamic housing of claim 30, wherein the external cooling source is a fan.

32. The thermally dynamic housing of claim 29, wherein the metallic layer is an aluminum-magnesium-lithium alloy.

33. The thermally dynamic housing of claim 29, wherein the heat source is an active heat source.

34. The thermally dynamic housing of claim 33, wherein the active heat source is a heat generating electronic component.

35. The thermally dynamic housing of claim 29, wherein the housing cools the area containing the heat source at a rate which is higher than a housing comprised of a metallic material alone.

36. A method for cooling an area containing a heat source and substantially enclosed by a housing comprising:

utilizing as the housing, a housing as recited in claim 29.

37. The method of claim 36, further comprising the step of providing an external cooling source disposed in thermal communication with said housing.

38. The method of claim 37, wherein the external cooling source is a fan.

39. The method of claim 36, wherein the housing is comprised of a metallic layer that is an aluminum-magnesium-lithium alloy.

40. The method of claim 36, wherein the heat source is an active heat source.

41. The method of claim 40, wherein the active heat source is a heat generating electronic component.

42. The method of claim 36, wherein the step of utilizing a housing further includes cooling the area containing the heat source at a rate which is higher than a housing comprised of a metallic material alone with said housing.

43. A method of making a device that actively discards internal heat, comprising:

enclosing an area having a heat source with a thermally dynamic housing as recited in claim 29.

* * * * *